United States Patent [19]

Chu

[11] Patent Number: 5,418,866
[45] Date of Patent: May 23, 1995

[54] SURFACE ACOUSTIC WAVE DEVICES FOR CONTROLLING HIGH FREQUENCY SIGNALS USING MODIFIED CRYSTALLINE MATERIALS

[75] Inventor: David K. Chu, Wilminton, Del.

[73] Assignee: E. I. Du Pont de Nemours and Company, Wilmington, Del.

[21] Appl. No.: 134,232

[22] Filed: Oct. 8, 1993

[51] Int. Cl.$^6$ .................... G02B 6/10; H01L 41/04
[52] U.S. Cl. ........................ 385/7; 385/130; 385/132; 385/141; 385/142; 359/285; 359/298; 310/313 R; 310/313 B
[58] Field of Search ............ 385/1, 2, 7, 8, 9, 14, 385/15, 130, 131, 132, 141, 142; 359/285, 287, 298, 305, 312, 323, 299; 310/313 R, 313 A, 313 B, 320

[56] References Cited

U.S. PATENT DOCUMENTS

| | | | |
|---|---|---|---|
| 4,139,277 | 2/1979 | Berg et al. | 359/285 X |
| 4,231,838 | 11/1980 | Gier | 156/600 |
| 4,533,207 | 8/1985 | Alferness | 385/132 |
| 4,766,954 | 8/1988 | Bierlein et al. | 156/624 |
| 5,002,349 | 3/1991 | Cheung et al. | 359/285 |
| 5,054,873 | 10/1991 | Davis et al. | 385/132 X |
| 5,066,356 | 11/1991 | Ferretti et al. | 156/623 R |
| 5,101,244 | 3/1992 | Jain et al. | 359/285 |
| 5,187,756 | 2/1993 | Shiba et al. | 385/7 |
| 5,218,653 | 6/1993 | Johnson et al. | 385/11 |
| 5,329,397 | 7/1994 | Chang | 359/308 |
| 5,350,961 | 9/1994 | Chu | 310/313 A |

OTHER PUBLICATIONS

White, R. M. et al., *Appl. Phys. Let.*, 7(12), 314–316, Dec. 15, 1965.
Kuhn, L., et al., *Appl. Phys. Lett.*, 17(6), 265–267, Sep. 15, 1970.
Buritskii, K. S., et al., *Sov. Tech. Phys. Lett*, 17(8), 563–565, 1991.
Wagers, R. S., et al., *IEEE Transactions on Sonics and Ultrasonics*, SU-31(3), 168–174, May 1984.
Bleustein, J. L., et al., *Appl. Phys. Lett.*, 13(12), 412–413, Dec. 15, 1968.
Tseng, C. C., *Appl. Phys. Lett.*, 16(6), 253–255, Mar. 15, 1970.
Lewis, M., et al., *1977 Ultrasonics Symposium Proceedings IEEE Cat. # 77CH1264-ISU*, 744–752.
Buritskii, K. S., et al, *Electronics Letters*, 27(21), 1896–1897, Oct. 10, 1991.
Fischer, J. H., et al, *IEEE Proceedings*, 75(1), 100–115, Jan. 1987.
Campbell, C. *Surface Acoustic Wave Devices and Their Signal Processing Applications*, Academic Press, Inc., San Diego, Calif., 329–356, 1989.
Martin, S. J., et al. *Transducers '87 Rec. of the 4th Int. Conf. on Solid-State Sensors and Actuators*, 478–481, 1987 (reprint).
Defranould, P., et al, *Proceedings of the IEEE*, 64(5), pp. 748–751, May 1974.
Oliner, A. A. (Ed.), *Acoustic Surface Waves*, Springer-Verlag, Chapter 5, pp. 187–192, 1978.
Baer, R. L., et al., *IEEE Ultrasonics Symposium*, 293–298, 1992.
Weller, J. F., et al, *Applied Physics Letters*, 31(3), 146–148, Aug. 1977.

(List continued on next page.)

*Primary Examiner*—Brian Healy

[57] ABSTRACT

Devices for controlling high frequency signals such as optic or electric signals are disclosed which utilize guided and/or reflected surface acoustic waves. The devices preferably use crystalline substrates modified (e.g., by ion exchange to increase mass density) to contain acoustic reflectors and/or continuous acoustic waveguiding channels (optionally, in combination with optical features such as optical waveguiding channels) and interdigital transducers deposited thereon to provide frequency generation (and reception where high frequency electrical signals are controlled). The preferred crystal substrates are of a material having a piezoelectric-elastic dielectric matrix capable of the generation of acoustic waves, such as $MTiOXO_4$ (where M is K, Rb, Tl, and/or $NH_4$ and X is P and/or As) having mm2 symmetry.

10 Claims, 3 Drawing Sheets

OTHER PUBLICATIONS

Smith, D. A., et al, *IEEE Transactions on Ultrasonics, Ferroelectrics and Frequency Control,* 40(1), 22–25, Jan. 1993.

Wang, X., "Acousto-Optic Tunable Filters Spectrally Modulate Light", *Laser Focus World,* May 1992.

Chatterjee, A., et al, *IEEE Transactions on Sonics and Ultrasonics,* SU-32(5), 745–759, Sep. 1985.

Ricco, A. J., et al, *Appl. Phys. Lett.,* 50(21), 1474–1476, May 25, 1987.

Tsai, C. S. (Ed.), *Guided-Wave Acousto-Optics,* Springer-Verlag, 123–127, 1990.

Smith, H. I., *Acoustic Surface Waves,* Springer-Verlag, 305–324, 1978.

Chu, D. K. T., Ph.D., Dissertation, pp. 57–64. Dec. 1991.

SURFACE ACOUSTIC WAVE DEVICES FOR CONTROLLING HIGH FREQUENCY SIGNALS USING MODIFIED CRYSTALLINE MATERIALS

FIELD OF THE INVENTION

This invention relates to acoustic wave devices employing crystalline materials, and more particularly to surface acoustic wave devices using crystalline materials which are modified to improve frequency control.

BACKGROUND

Surface acoustic waves (i.e., "SAWs") also known as Rayleigh waves, have been known since the middle of the nineteenth century. However, it was not until much later that the phenomenon of SAW propagation was first exploited for its applications to electronic devices. Acoustic wave devices known in the art commonly consist of a substrate on which a conductive material is deposited in a predetermined pattern. The patterned conductive material is known as an interdigital transducer (i.e., an IDT). R. M. White et al., Appl. Phys. Let., Volume 7, Number 12, pages 314–316 (Dec. 15, 1965), describes the use of the IDT as an efficient technique for the generation and detection of surface acoustic waves on a piezoelectric surface. An IDT may be suitably connected to an electrical input so that the refractive index in a crystal is changed as required by acoustic-optic applications. See, e.g., K. S. Buritskii et al., Soy. Tech Phys. Lett. 17(8) pp. 563–565 (1991) and L. Hunn et al., Appl. Phys. Lett. 17(6) pp. 265–267 (1970). In other applications, an IDT on one end of a substrate surface may be connected to a source of the frequency waves (e.g., television antenna—radio frequency) and an IDT on the other end of the substrate surface may be connected to a device designed to receive a predetermined frequency (e.g., radio frequency for a specific television channel). The design of the IDT (i.e., the pattern of the conductive materials on the surface of a particular type of substrate) determines how the frequency will be controlled (e.g., which channel is received).

Frequency control devices using substrates capable of controlling the received frequency by the generation of acoustic waves known in the art are based on either bulk, i.e. unmodified, or modified crystalline material. For example, R. S. Wagers et al., IEEE Transactions on Sonics and Ultrasonics, Vol. SU-31, No. 3, pages 168–174 (May 1984) discloses acoustic wave devices based on bulk lithium niobate. Commonly assigned copending application Ser. No. 07/924,691, filed Jul. 31, 1992, now U.S. Pat. No. 5,350,961, discloses the use of bulk potassium titanyl phosphate (KTP) and surface modified domain reversed KTP in acoustic wave devices. K. S. Buritskii et al., Electronics Letters, Vol. 27, No. 21, pages 1896–1897 (Oct. 10, 1991), discusses the excitation of SAWs in Rb:KTP formed by Rb ion exchange on the entire surface of a single crystal of KTP). Buritskii et al., Sov. Tech. Phys. Lett., Volume 17, Number 8, pages 563–565 (August 1991) discusses the fabrication of a planar acousto-optic modulator using the Rb:KTP crystal.

The performance of frequency control devices based on acoustic waves is generally enhanced by providing some mechanism for guiding the acoustic waves. There are many types of acoustic waveguides currently available. For example, overlay waveguides employ a strip of one material placed on a substrate of another material. Substrate modified waveguides involve a local change produced in the properties of the substrate material (*Acoustic Surface Waves*, A. A. Oliner (Ed.) Springer-Verlag, P188, Ch 5, 1978). Acoustic waveguides of the substrate modified type have been made by ion-exchange processes using lithium niobate. The ion-exchanged region in the material will possess different physical properties from the unchanged region. The property variations due to the externally induced ions may include changes in mass density, optical refractive indices, changes in electromechanical coupling coefficients, and the variations in the acoustic velocities etc. (J. F. Weller, J. D. Crowley, and T. G. Giallorenzi, Appl. Phys. Lett., V 31, p 146–148, 1977). The larger the difference in physical properties between the ion-exchanged region and the non-ion-exchanged region, the better the waveguide confinement is. Due to the guiding effect, it is possible to enhance the device performance in acoustic beam focusing, beam reflection, and power density. In addition to the frequency control and signal processing applications, because of the tight confinement of the acoustic energy in the acoustic waveguide, the waveguide prevents the acoustic energy from leaking into overlay liquid such as water (R. L. Baer, C. A. Flory, M. Tom-Moy, and D. S. Solomon, IEEE Ultrasonics Symposium, p 293–298, 1992). Hence, the guiding property is very useful to convert acoustic wave devices from useless in liquid sensing into a highly sensitive sensing devices such as immunosensors. In wireless communication such as cellular phones, an important issue is to prevent the crosstalk (interference).

Acoustic waveguides also have great influences on devices in the optical signal processing applications such as acousto-optic tunable filters (AOTF) and acousto-optic modulators. The acousto-optic (A-0) modulators can be used in optical communications (D. A. Smith, and J. J. Johnson, IEEE Trans.on UFFC, V 40, p 22–25, 1993) and the acousto-optic tunable filters are useful in the entertainment, and analytical spectroscopy (X. Wang, *Laser Focus World*, May 1992). Since the performance of these devices is highly sensitive to the acoustic and light fields (*Guided-Wave Acousto-Optics*, Chen S. Tsai (Ed.), Springer-Verlag, 123–127, 1990), acoustic waveguides can provide a solution to the engineering optimization due to the abilities of increasing power density (more efficient), and controlling the optical phase.

The number of devices requiring frequency control has grown in number and complexity, and the demand for improved devices has grown commensurately.

SUMMARY OF THE INVENTION

This invention provides devices for controlling high frequency signals by the generation of surface acoustic waves. The devices of this invention include (a) a crystalline substrate of a material having a piezoelectric dielectric matrix capable of the generation of surface acoustic waves and a surface with a signal input area and an output area, and (b) an input interdigital transducer deposited on the signal input area of said substrate surface, suitable for connection to a source of electric signal for inverse piezoelectrically generating surface acoustic waves in the substrate; and the devices of this invention are characterized by said crystalline substrate being modified to improve frequency control. In one aspect of this invention, the crystalline substrate is modified to include a continuous channel waveguide for surface acoustic waves with an input channel end at the signal input area of the substrate surface and an output channel end at the output area of the substrate surface. The input interdigital transducer is deposited on the signal input area at the channel input end; and the continuous channel waveguide has a composition different from the composition of the substrate material and physical properties sufficiently different from the physical properties of the substrate material to lower the velocity of the surface acoustic waves (compared to the wave velocity in the substrate) and to substantially confine surface acoustic waves in the channel waveguide. In a second aspect of this invention, the crystalline substrate is modified to include at least one reflector extending into the crystalline substrate normal to the surface of the crystalline material. Such reflectors have a composition different from the composition of the substrate material and a mass density sufficiently higher than the mass density of the substrate material to substantially reflect acoustic waves; and such reflectors are positioned to reflect surface acoustic waves in a selected direction (e.g., toward the output area of the substrate surface). These two aspects may be used alone or together to enhance the performance of the surface acoustic wave devices. For controlling high frequency electrical signals, the devices typically include an output interdigital transducer deposited on the output area of the substrate surface, suitable for piezoelectrically detecting said surface acoustic waves and for connecting the output interdigital transducer to an electric signal responsive device.

DETAILED DESCRIPTION

This invention includes certain surface acoustic devices employing crystalline substrates (e.g., a substrate of $MTiOXO_4$ where M is K, Rb, Tl and/or $NH_4$ and X is P and/or As) with continuous channel waveguides from an input area to an output area. The waveguides have compositions different from the compositions of the substrates. The physical properties of such waveguides are sufficiently different from those of the unmodified crystalline substrate materials to substantially confine a surface acoustic wave generated in the continuous channels (e.g., a higher mass density, higher optical refractive index, slower acoustic velocity and/or larger electromechanical coupling coefficient). The surface acoustic wave may thus be directed by the channel configuration.

Figure 1:
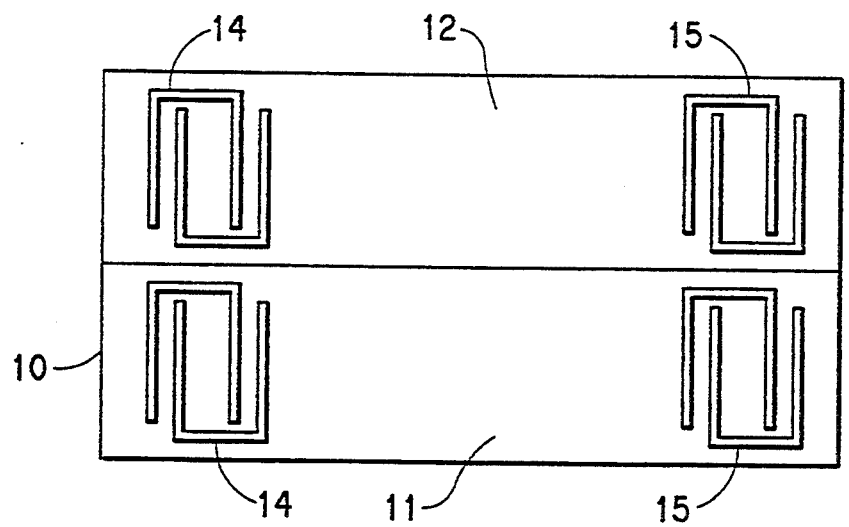
FIG. 1 is a schematic drawing of a frequency controlling device illustrating acoustic waveguiding in an ion-exchanged surface adjacent to unmodified surface of bulk crystalline substrate.

A device for high frequency control application by the generation of surface acoustic waves illustrating the acoustic waveguiding aspect of this invention is shown in FIG. 1. FIG. 1 represents the surface of the crystalline substrate (10), (e.g., a crystal of $MTiOXO_4$) where one portion of the surface (11) is original substrate material and another portion of the surface (12) has been ion-exchanged to change its composition. Each portion (11) and (12) has an input (i.e., generating) IDT (14) and an output (i.e., receiving) IDT (15). Upon providing equivalent signals through the input IDTs (14) in both the bulk crystalline portion (11), and the ion-exchanged crystalline portion (12), the velocity of surface acoustic waves in the ion-exchanged region is found by monitoring the output from the respective output IDTs (15) to be lower than the velocity of the surface acoustic waves generated in the bulk crystalline region. This illustrates that the ion-exchanged region is capable of acting as a acoustic waveguide. Therefore, in accordance with this invention one can control the travel time from the generating IDT to the receiving IDT of the SAW device by employing a channel waveguide between the IDT's so that acoustic waves will be guided along the length of the waveguide to achieve the desired traveling time. For example, this invention provides a device for controlling the travel time of high frequency signals generated therein which comprises a piezoelectric crystalline material having a continuous channel thereon, said continuous channel having an input end and an output end and characterized by physical properties (e.g., a higher mass density) sufficiently different from the piezoelectric crystalline material to lower the acoustic velocity and to confine a surface acoustic wave generated in the continuous channel, an input IDT deposited on the input end of the channel, and an output IDT (suitable for piezoelectrically detecting the surface acoustic waves and for connecting the output interdigital transducer to an electric signal response device) on the output area of the output end of the channel. The input (i.e., generating) and output (i.e., receiving) IDTs on this device can be connected to any desired frequency input and output device, respectively. Using a device of this configuration one can control the amount of time it takes for an acoustic wave generated by the signal received by the input IDT to travel to the receiving IDT without enlarging the total length of the crystalline piezoelectric material. Accordingly, devices of this type can function as frequency control delay-line devices. For example, in one embodiment of this device the continuous channel can be curved within a given size crystalline material to lengthen the path along which the surface acoustic wave is guided and, therefore, to increase the time for an acoustic wave to travel from the generating IDT to the receiving IDT.

Figure 2:
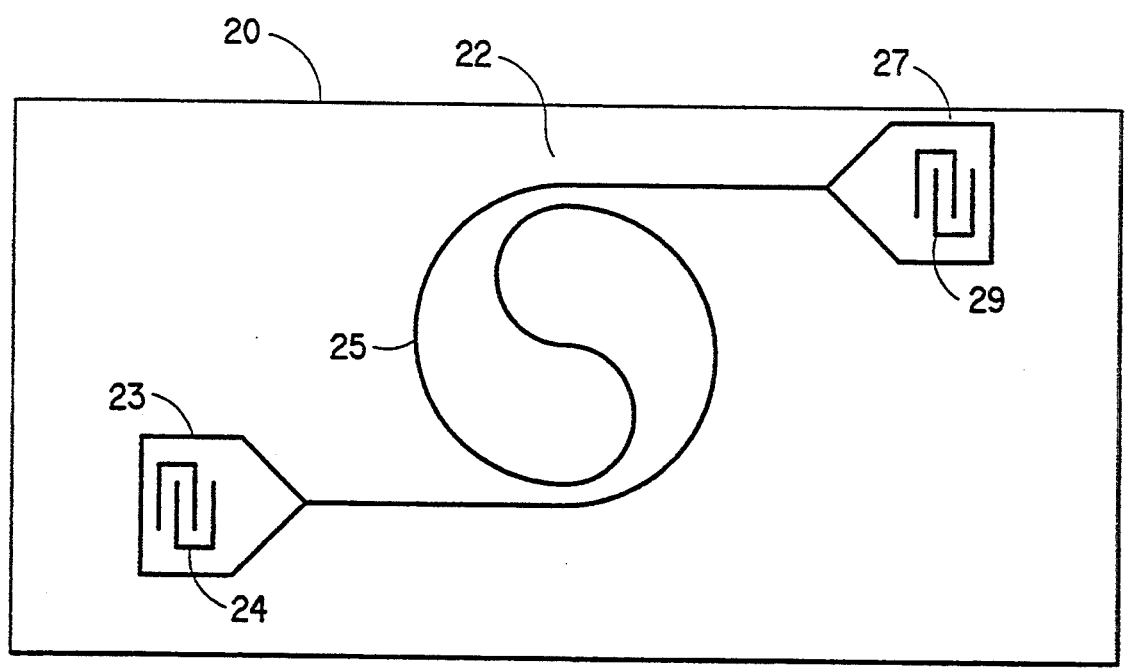
FIG. 2 is a schematic drawing of an acoustic wave delay device

FIG. 2 illustrates an acoustic wave delay device in accordance with this invention. The device (20) of FIG. 2 includes a crystalline substrate surface (22), having an ion-exchanged region at an input area (23) and a generating IDT for the signal source (24) on the ion-exchanged input region (23), which produces surface acoustic waves. The surface acoustic waves are guided through an ion-exchanged waveguide region (25) of the crystal surface to an ion-exchanged region at the output area (27), where a receiving IDT (29) is provided to receive the generated waves. It is clear that one could increase the length of the acoustic waveguiding channel, if necessary, by intertwining the curve having acoustic waveguide characteristics.

This invention also includes certain surface acoustic devices employing crystalline substrate with reflectors for reflecting acoustic waves generated in the substrate toward the output area. The design (e.g., length, depth, and/or orientation) and location of the reflector(s) will vary with specific applications. For example, this invention provides a frequency control devices based on acoustic wave generation which use one or more reflectors to lower acoustic wave energy loss in the device. Bidirectional surface acoustic waves are always generated when using acoustic transducers (e.g., IDTs) in acoustic wave devices. Due to this bidirectional generation, there is typically an inherent 50% energy loss, because the conventional devices fail to utilize (i.e., recollect) the acoustic wave propagating opposite to the desired direction. This invention provides a means to reduce the loss using composition changes to provide reflectors so that the waves can be recollected in a coherent manner. (The art has used metallic strips to reflect acoustic waves. However, a large number of strips is required due to the weak reflectance between the substrate material and the metal strip). One way to miniaturize acoustic wave devices and reduce the energy loss is to employ high reflectance reflectors (i.e., large changes in mass density).

This invention provides for a frequency control device having reduced acoustic energy loss which comprises a piezoelectric crystalline material having an input area and an output area, an input (i.e., generating) IDT at the input area, an output (i.e., receiving) IDT (suitable for detecting the surface acoustic waves and for connecting the output IDT to an electric signal response device) at the output area, and at least one input reflector at the input area extending into the piezoelectric crystalline material normal to the surface of the piezoelectric crystalline material, said reflector(s) having a mass density sufficiently higher than the piezoelectric crystalline material to reflect surface acoustic waves generated therein. The device also preferably comprises at least one output reflector at the output area extending into the piezoelectric crystalline material normal to the surface of the piezoelectric crystalline material characterized by a mass density sufficiently higher than the piezoelectric crystalline material to reflect surface acoustic waves generated therein. Where output IDT is employed, reflectors (e.g., reflectors at the input area and/or the output area) may be advantageously used to reflect surface acoustic waves toward the output IDT. The generating and receiving IDTs on this device can be connected to any desired frequency input and output device, respectively. Using reflectors, the acoustic waves generated by the generating IDT can be tightly confined, resulting in a reduction in energy loss.

Figure 3:
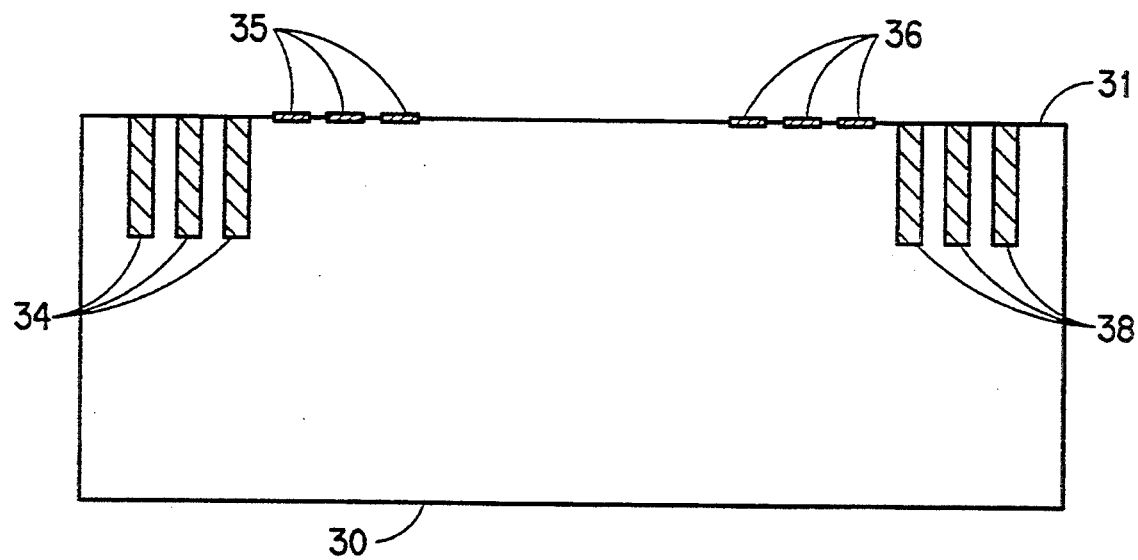
FIG. 3 is a schematic cross-sectional drawing of a frequency controlling device utilizing a bulk crystalline substrate and acoustic wave reflectors.

Generally, an IDT not only generates surface acoustic waves which propagate in the desired direction (i.e., toward the detecting IDT) but also generates surface acoustic waves in the direction opposite to the desired acoustic waves. Therefore, inherently in unmodified crystalline substrate, 50% of the acoustic energy can be lost. The embodiment of the invention shown in FIG. 3 illustrates how to configure a device using ion-exchanged regions as reflectors to collect oppositely directed surface waves and reflect them back in the desired direction. In this embodiment a bulk crystal (e.g., a crystal of. MTiOXO4) (30) has a surface (31) with ion-exchanged regions (34) which act as acoustic wave reflectors. The reflectors (34) are located next to an input (i.e., generating) IDT (35). A detecting IDT (36) is also provided on surface (31) of crystal (30), and reflecting ion-exchanged regions (38) are also located next to the detecting IDT. Acoustic waves generated by the generating IDT (35) result in acoustic waves which are in part reflected from the ion-exchanged regions (34) and (38) toward the detecting IDT (36).

Utilizing continuous channel acoustic waveguides alone or in combination with the acoustic reflectors in accordance with this invention is particularly advantageous in preventing energy losses into a liquid overlay caused by the compressional mode coupling. This makes surface acoustic waves more suitable for liquid sensing applications such as immunosensors and water contamination control. It is well known that conventional surface acoustic wave devices are not practical for liquid sensing applications due to a large coupling effect between surface acoustic waves and liquids (see, e.g., A. J. Ricco and S. J. Martin, Applied Physics Letters, Vol. 50, 1474–1476, 1987). In accordance with this invention it is possible to reduce this coupling loss by confining the. SAW energy within the bulk substrate. Consequently, a container for liquid (e.g., a ring for confining the liquid to a particular area on the crystal surface) can be placed upon a channel waveguide between the input (i.e., generating) and output (i.e., receiving) IDT's, and the device may be used for liquid sensing (e.g., to perform incubation for immunosensing). Depending on the type of sensing application, the liquid may be placed directly upon the waveguide (i.e., the container can be omitted).

Figure 4:
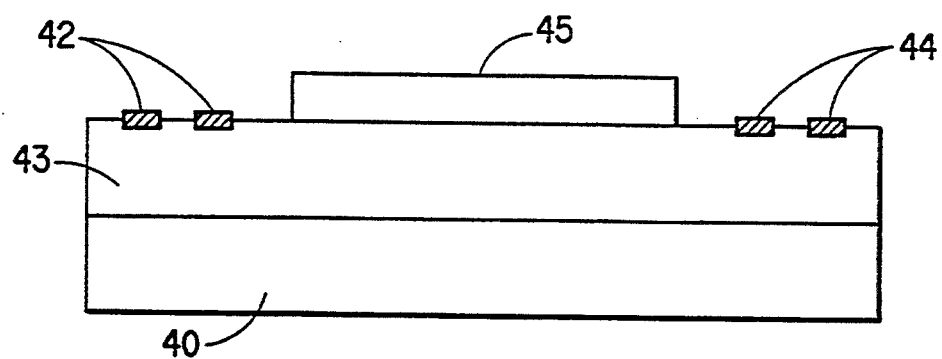
FIG. 4 is a schematic cross-sectional drawing of a frequency control device utilizing a bulk crystalline substrate and an ion-exchange waveguide for use with a liquid sample to reduce energy leakage into the sample.

An ion-exchanged liquid sensor in accordance with this invention may have the following elements shown in the FIG. 4: a crystal substrate (40) (e.g., a crystal of MTiOXO4); an IDT for surface acoustic wave generation (42); an acoustic waveguiding channel (such as ion-exchanged region (43)) for confining the surface acoustic waves generated by IDT (42); an output IDT for surface acoustic wave detection (44); a liquid container (45) which contains a liquid solution (buffer or water). Without confinement of the surface acoustic waves, some of the acoustic waves generated by the IDT (42) would leak into liquid solution contained in container (45). However, the acoustic waveguiding channel (43) reduces leakage of the acoustic waves into the liquid solution by tightly confining the acoustic energy.

This invention also provides for improving the diffraction efficiency of acousto-optic modulators by increasing the acoustic wave energy density, and by better controlling the spatial distribution of surface acoustic waves using acoustic waveguides. The diffraction efficiency of SAW acousto-optic (SAW A-O) devices such as A-O modulators and A-O tunable filters is a sensitive function Of the spatial distributions of the diffracted and undiffracted SAWs and optical waves (see, e.g., C. S. Tsai (Ed.), Guided-Wave Acousto-Optics, Springer-Verlag, 123–127, 1990). It is, therefore, important not only to control the spatial distributions of optical waves (as conventional techniques do) but also to control the SAW spatial distribution. This invention includes devices using continuous channel waveguides to guide both acoustic and optical waves. For example, this invention provides a device for acoustic-optic applications which comprises a piezoelectric crystalline material having a continuous channel thereon (said continuous channel having an input end and an output end and characterized by physical properties sufficiently different from the piezoelectric crystalline material to confine a surface acoustic wave generated in the continuous channel) an input (i.e., generating) IDT on the input end of the continuous channel and an output (i.e., receiving) IDT on the output end of the continuous channel, an optical channel having an optical input end and an optical output end which is capable of guiding optical waves and intersects said continuous channel for confining surface acoustic waves, and a source of optical waves to the optical input end of the optical channel (e.g., a laser focused into the optical input end). The generating and receiving IDTs on this device can be connected to any desired frequency input and output device, respectively. Utilizing this device configuration one can influence the frequency read at the receiving IDT using optical waves which are propagated through the optical channel. Another device for acoustic-optic applications in accordance with this invention is a device for acoutic-optic modulation, which requires the use of only an input IDT for generating acoustic waves. The acoustic waves travel through the continuous acoustic channel waveguide to its intersection with the optical channel waveguide to affect the frequency of the optical waves propagating through the optical channel waveguide. In this acoustic-optic modulator, the output includes optical waves which have a frequency different from the frequency of the waves generated by the light source. The device can include or can be used with an optical detector (e.g., a silicon photodiode) for detecting optical waves from the output end of the optical channel.

Figure 5:
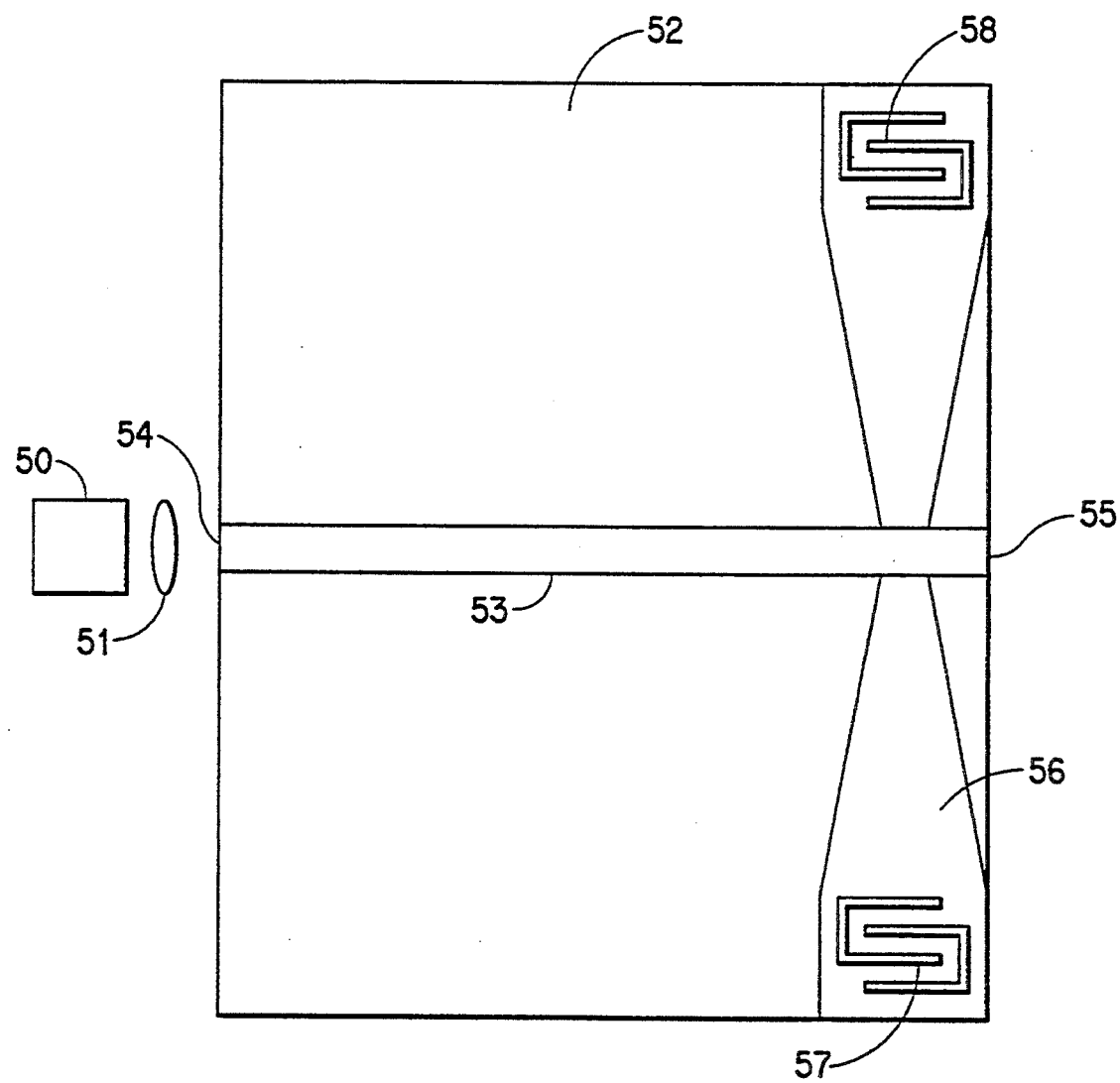
FIG. 5 is a schematic drawing of an integrated acousto-optic device (for instance an A-O modulator) utilizing waveguiding channels to focus both the acoustic and optic waves into a small interaction area.

Acousto-optic (A-O) modulators are useful devices in applications such as optical communication and spectrometry. It is well known that A-O devices are strongly influenced by the optical and acoustic fields associated with the optical and acoustic waves employed therein. This invention provides a structure that has the capability to control not only the optical waves, as conventional devices do, but also to control the surface acoustic waves. One acousto-optic modulator in accordance with the invention, shown in FIG. 5, comprises of the following elements: a light source (50); an optical lens (51) to focus light from a light source (50); crystalline $MTiOXO_4$ (52); an optical waveguiding channel (e.g., an ion-exchanged region) (53) in the crystalline $MTiOXO_4$ having an optical input end (54) and an optical output end (55); an acoustic waveguiding channel (e.g., an ion-exchanged region) (56); a generating IDT (57) located at an acoustic input area; and a receiving IDT (58) located at an output area. Utilizing this device optical waves guided along optical waveguiding channel (53) can influence the frequency of surface acoustic waves propagated through acoustic waveguiding channel (56). The frequency output can be read by connecting any conventional device (e.g., an electrode) to the receiving IDT (58). One can configure this device to read frequency modulated optical output by adding an optical sensing device at the output end of the optical waveguiding channel (55) to monitor how the frequency of the guided light is changed by the acoustic signal from the generating IDT (57); and, if desired, eliminating the receiving IDT (58).

The preferred piezoelectric crystalline material for the practice of this invention is crystalline $MTiOXO_4$, where M is selected from the group consisting of K, Rb, Tl, $NH_4$, and mixtures thereof, and X is selected from the group consisting of P, As and mixtures thereof. This material can be prepared in the mm2 crystal symmetry by a variety of methods well known in the art. Two fundamental methods are commonly used; one, known as the hydrothermal method (see, e.g., U.S. Pat. No. 5,066,356) and the other, known as the flux method (see, e.g., U.S. Pat. 4,231,838). Of the many $MTiOXO_4$ analogues, $KTiOPO_4$ is most preferred. The crystalline substrate can be in the form of a single crystal or crystalline thin film, so long as the crystal symmetry is mm2. In use the crystalline substrate can be cut along the x-, y- or z-axis. When the crystalline substrate of $MTiOXO_4$ is used for SAW generation, the input IDT should be deposited on the signal input area such that the SAWs are generated in the x or y direction in said substrate. All rotated cuts will work for the generation of SAW (surface acoustic waves) or SSBAW (subsurface bulk acoustic waves) except x- and y-principle cut. The acoustic and optical waveguiding channels in the crystalline substrate can be prepared by a variety of methods well known in the art, such as ion exchange (see e.g., the ion exchange method described in U.S. Pat. No. 4,766,954, which is hereby incorporated herein by reference). Reflectors may also be provided using such ion exchange. This invention provides devices having a substrate of crystalline $MTiOXO_4$, wherein the acoustic waveguide channels, the optical waveguide channels, and the reflectors (when each is present) are ion exchanged $MTiOXO_4$ having higher mass density than the substrate material.

The types of waves generated in the crystalline substrate are fundamentally determined by crystal structure. The SAW generated in the crystalline substrates travel through the substrate at rates of about 3600 meters per second; SSBAW, 6000 meters per second; and bulk acoustic waves, 7800 meters per second. An application of this invention lies in the generation of SAW waves in bulk crystals, which can only be generated in certain crystal structures (e.g., mm2 crystal symmetry common to z-cut $MTiOXO_4$). SAW can be generated directly on a z-cut $MTiOXO_4$ substrate without any ionic dopants such as rubidium.

Interdigital transducers can be deposited on the surface of the crystalline substrate by conventional lithographic techniques, such as those described by H. I. Smith, Acoustic Surface Waves, Fabrication Techniques for Surface Wave Devices, Pages 305–324, Springer-Verlag, Berlin Heidelberg, New York (1978). To develop the desired pattern onto $MTiOXO_4$ substrate one may use the following steps: (1) prepare the $MTiOXO_4$ substrate (usually z-cut for SAWs or x- or y-cut for BG waves); (2) polish the substrate to provide a flatness better than half wavelength (typically about 0.3 $\mu m$ flatness variation); (3) evaporate a conductive material, typically a metal film such as titanium about 1000 Å thick, onto the crystalline substrate using an electron beam evaporator; (4) spin a positive photoresist (e.g., a photopolymer) onto the substrate and softbake (prebake) at a suitable temperature and time period for the photoresist used; (5) align a predesigned photomask and expose it to light for a time sufficient to develop the desired resolution; (6) hardbake (postbake) for a suitable time and temperature for the photoresist used; (7) develop the exposed photoresist using a suitable developer; (8) etch the titanium off the area which has no photoresist cover; and (9) strip off unexposed photoresist using specified stripper (e.g., acetone). After all these processing steps, one can use a commercially available network analyzer such as Hewlett-Packard 8753C to analyze the performance of the devices. The pattern chosen for the IDT determines how the frequency is controlled. The operating frequency of an acoustic wave device is determined by the following equation:

$$f = v/\lambda$$

where v is the velocity of the acoustic wave generated in the device by the IDT and λ is the wavelength of the acoustic wave generated in the device by the IDT. Conventionally, the wavelength of the acoustic wave is determined by the IDT pattern. The smaller the width of the IDT "finger" in the direction of wave propagation, the smaller the wavelength of the acoustic wave generated in the device by the IDT, or the higher the operating frequency.

The connections used between the interdigital transducers and either the high frequency signal or the signal responsive device are typically conventional conductive materials such as metal wires. For research purposes, a microwave probe head (Cascade Microtech SN17307, Cascade Microtech Inc., PO Box 1589, Beaverton, Oreg. 97057-1589) can be used instead of wires to receive electrical signals generated from a network analyzer and then input the signals to the first IDT to excite acoustic waves; and another probe head can be used on the signal end of the substrate surface to direct acoustic waves to receive the output to the network analyzer to analyze the transmission properties of the device.

Practice of the invention is further illustrated by the following non-limiting example.

EXAMPLES

Example 1

An ion-exchange bath was prepared to have thallium ion exchange experiment done in a z-cut flux-grown KTP substrate. The substrate was polished on both sides to a flatness of about one half of a wavelength. The ion-exchange bath contained about 99% weight percent of thallium nitrate, and about 1% barium nitrate. The ion-exchange process took place at about 360° C. for about 45 minutes. The photomask used had two uniform interdigital transducers (IDT's) with a periodicity of about 16 μm. The thallium-exchanged KTP SAW device exhibited a center frequency at 212.5 MHz corresponding to a SAW velocity of about 3300 m/sec, The SAW velocity of an unchanged flux KTP z-cut plate is about 4000 m/sec. Therefore, the variation in the acoustic velocity caused by the externally induced thallium ions was about 17.5% reduction. This is considered more than enough to constitute an acoustic waveguide (only a few percent is believed necessary to guide acoustic waves). This strong variation in acoustic velocity due to the thallium ions indicates that the Tl exchanged acoustic waveguide has a very tight confinement in the acoustic field which is useful in applications such as optical communications, frequency control, signal processing, and the liquid sensors. It was also found that there was very little insertion loss caused by the Tl exchange process (only about 1 dB more). This is a good indication that the Tl exchange process can also be used for forming reflectors in nonlinear acoustic devices. It is believed that similar effects can be achieved using other ions such as Cs and Rb. It is also conceivable that guiding effect can be achieved using ions such as Ga to replace Ti sites in $MTiOXO_4$ crystals.

Particular embodiments of the invention are illustrated by the Examples. Other embodiments will become apparent to those skilled in the art from a consideration of the specification or practice of the invention disclosed herein. It is understood that modifications and variations may be practiced without departing from the spirit and scope of the novel concepts of this invention. It is further understood that the invention is not confined to the particular formulations and examples herein illustrated, but it embraces such modified forms thereof as come within the scope of the claims which follow.

What is claimed is:

1. A device for controlling high frequency signals by the generation of surface acoustic waves, including (a) a crystalline substrate of a material having a piezoelectric-elastic dielectric matrix capable of the generation of surface acoustic waves and a surface with a signal input area and an output area, and (b) an input interdigital transducer deposited on the signal input area of said substrate surface suitable for connection to a source of signal and for inverse piezoelectrically generating surface acoustic waves in the crystalline substrate, characterized by:

said crystalline substrate having a channel waveguide for surface acoustic waves said waveguide extending from the input area of the substrate to the output area of the substrate, said waveguide having an input channel end at the input area of the substrate surface and an output channel end at the output area of the substrate surface; and said waveguide having a composition different from the composition of the substrate material and a mass density, optical refractive index, acoustic velocity or electromechanical coupling coefficient sufficiently different from the such properties of the substrate material to lower the velocity of the surface acoustic waves within said waveguide relative to the velocity of the surface acoustic waves in the substrate to substantially confine surface acoustic waves in said channel waveguide; and said input interdigital transducer being deposited on the signal input area at the channel input end.

2. A device in accordance with claim 1 further characerizied by:

having an output interdigital transducer deposited on the output area at the channel output end which is suitable for piezoelectrically detecting the surface acoustic waves and for connecting the output interdigital transducer to an electric signal responsive device.

3. A device in accordance with claim 2 for controlling the travel time of high frequency signals generated therein further charcterized by:

said channel waveguide being curved to increase the time for a surface acoustic wave to travel from the input interdigital transducer to the output interdigital transducer.

4. A device in accordance with claim 2 for liquid sensing further characterized by:

a container for liquid placed upon the channel waveguide between the input interdigital transducer and the output interdigital transducer.

5. A device in accordance with claim 2 for acoustic-optic application further characterized by:

an optical channel having an optical input end and an optical output end, which is capable of guiding optical waves and intersects said continuous channel for surface acoustic waves; and a source of optical waves to the optical input end of the optical channel.

6. A device in accordance with claim 1 for acoustic-optic modulator further characterized by:
an optical channel having an optical input end and an optical output end, which is capable of guiding optical waves and intersects said continuous channel for surface acoustic waves;
a source of optical waves to the optical input end of the optical channel; and
an optical detector for detecting optical waves from the output end of the optical channel.

7. A device for controlling high frequency signals by the generation of surface acoustic waves, including (a) a crystalline substrate of a material having a piezoelectric-elastic dielectric matrix capable of the generation of surface acoustic waves and a surface with a signal input area and an output area, and (b) an input interdigital transducer deposited on the signal input area of said substrate surface suitable for connection to a source of signal and for inverse piezoelectrically generating surface acoustic waves in the crystalline substrate, characterized by:
said crystalline substrate having at least one reflector extending into the crystalline substrate normal to the surface of the crystalline material; said at least one reflector having a composition different from the composition of the substrate material and a mass density sufficiently higher than the mass density of the substrate material to substantially reflect surface acoustic waves in a selected direction.

8. A device in accordance with claim 7 further characterized by:
having an output interdigital transducer suitable for piezoelectrically detecting the surface acoustic waves and for connecting the output interdigital transducer to an electric signal responsive device; and
having at least one reflector at the input area of the substrate surface positioned to reflect surface acoustic waves toward the output interdigital transducer.

9. A device in accordance with claim 8 further characterized by:
having at least one reflector at the output area of the substrate surface positioned to reflect surface acoustic waves toward the output interdigital transducer.

10. A device in accordance with any one of claims 1 through 9 wherein the substrate is crystalline MTiOXO$_4$ where M is selected from the group consisting of K, Rb, Tl, NH$_4$ and mixtures thereof and X is selected from the group consisting of P, As and mixtures thereof; and wherein the acoustic waveguide channels, the optical waveguide channels and the reflectors, when present, are ion-exchanged MTiOXO$_4$ having higher mass density than the substrate material.

* * * * *